United States Patent [19]

Inagaki

[11] 4,386,421
[45] May 31, 1983

[54] MEMORY DEVICE

[75] Inventor: Yasaburo Inagaki, Tokyo, Japan

[73] Assignee: Nippon Electric Co., Ltd., Tokyo, Japan

[21] Appl. No.: 184,446

[22] Filed: Sep. 5, 1980

[30] Foreign Application Priority Data

Sep. 7, 1979 [JP] Japan .................. 54/115021

[51] Int. Cl.³ .............................................. G11C 13/00
[52] U.S. Cl. ....................................... 365/230; 365/73
[58] Field of Search ................. 365/230, 231, 233, 73, 365/75, 78

[56] References Cited

U.S. PATENT DOCUMENTS 4,263,664  4/1981  Owen et al. .................. 365/230
4,271,488  6/1981  Saxe .............................. 365/230

Primary Examiner—Terrell W. Fears
Attorney, Agent, or Firm—Sughrue, Mion, Zinn, Macpeak & Seas

[57] ABSTRACT

A memory device having a large memory capacity which can be utilized either as a random access memory or a serial access memory is disclosed. The memory device comprises memory cells arrayed in a matrix form and a shift register whose output is used for selecting the memory cells.

6 Claims, 11 Drawing Figures

MEMORY DEVICE

BACKGROUND OF THE INVENTION

The present invention relates to a memory device, and more particularly, to a dynamic type memory device.

Memory devices employing insulated gate field effect transistors have been widely used as the most common memories. As is well known, memory devices are generally classified depending upon their modes of access into random access memories (RAMS) and serial access memories. A random access memory is constructed by arraying memory cells in a matrix form and disposing peripheral circuits such as address inverters, decoders, etc. along the periphery of the matrix. In such type of random access memories, a memory cell is formed of a one-transistor and one-capacitor element, and hence the memory matrix can be constructed at a high density. However, in contrast to ease in high density integration of the memory cell matrix, in a peripheral circuit such as, for example, a decoder, the number of input transistors of NOR gates for the respective word lines or the respective digit lines would increase in proportion to the enlargement in memory capacity of the memory cell matrix. In other words, the number of circuit elements necessitated per word line or per digit line in the peripheral circuit increases in proportion to the increase in the memory capacity, and the space on a chip occupied by the entire peripheral circuit that is required for the memory device is rapidly increased. Consequently the proportion of the area occupied by the memory cells on a semiconductor chip is strictly limited, and hence it is difficult to obtain a memory device having a large memory capacity on a small area of a semiconductor chip.

On the other hand, among the serial access memories a shift register is known as a typical one, and in this type of memory, peripheral circuits such as decoders or the like are unnecessary. However, a memory unit of one bit is constructed by cascade connection of two stages of inverters each provided with sampling gate transistors. Accordingly six transistors are necessitated per bit, and thus a very large number of transistors were necessitated in the case of a large memory capacity. In other words it was not practical to realize a serial access memory having a large memory capacity.

Recently, in accordance with the development of the technique of digitally processing signals, such as the technique of digital filters for analog signals, the requirement for a large capacity memory device, especially for a serial access memory having a large memory capacity has been enhanced.

SUMMARY OF THE INVENTION

Therefore, it is one object of the present invention to provide a memory device having a large memory capacity.

Another object of the present invention is to provide a memory device that can be utilized either as a random access memory or a serial access memory.

Still another object of the present invention is to provide a serial access memory device having a large memory capacity.

According to one feature of the present invention, there is provided a memory device comprising memory cells arrayed in a matrix form and a shift register whose output is used for selecting the memory cells.

According to another feature of the present invention, there is provided a serial access memory device comprising memory cells arrayed in a matrix form of M rows by N columns, N units of sense amplifier circuits for sensing information stored in the memory cells, an X shift register having M bits and a Y shift register having N bits for selecting the memory cells, an output circuit for reading information in the sense amplifier circuits, a write circuit for writing information in the memory cells, and a control timing generator circuit for controlling the above-referred various circuits.

According to one aspect of the invention, there is provided a memory device comprising a memory cell matrix including a plurality of memory cells arranged in rows and columns and address means for designating the rows, the address means including a first shift registers having control terminal, first means responsive to outputs of the shift register for selecting one of the rows and second means for operatively supplying the control terminal with a signal for controlling shift operation of the first shift register. The address means including the shift register according to the invention may be provided for either rows or columns or for both of the rows and columns.

According to another aspect of the invention, there is provided a memory device comprising memory cell array including a plurality of memory cells arrayed in rows and columns, a first shift register having a plurality of outputs, the number of the outputs of the first shift register being not less than the number of the rows, a control terminal, first means for initializing the outputs of the first shift register so that only one output among the outputs of the first shift register is set at a selection level, second means responsive to the outputs of the first shift register for selecting one of the rows, and third means coupled to the control terminal for controlling shift operation of the first shift register.

According to still another aspect of the invention, there is provided a memory device comprising memory cell matrix including a plurality of memory cells arranged in rows and columns, a first shift register having the same number of parallel outputs as the number of the rows, a second shift register having the same number of parallel outputs as the number of the columns, first means for initializing state of the first shift register whereby only one output among the outputs of the first shift register is set at a selective level, second means for initializing state of the second shift register whereby only one output among the outputs of the second shift register is set at a selective level, third means for controlling the first shift register, fourth means for controlling the second shift register, fifth means responsive to the outputs of the first shift register for designating one of the rows, and sixth means responsive to the outputs of the second shift register for designating one of the columns.

According to still another aspect of the present invention, there is also provided a method for addressing a memory device formed on a semiconductor chip and has a matrix of memory cells arrayed in rows and columns, row selection means for designating one of the rows, means for supplying said row selection means with row address information, a shift register whose outputs are used to designate one of the columns and means for supplying the shift register with a shift signal, which method comprises the steps setting only one of the outputs of the shift register at a selective level, supplying row address information to the row selection means thereby to select one of the rows, and supplying the shift signal to the shift register thereby to shift the selective level to a desired position of the outputs in the shift register.

The mentioned method may further comprise the step of applying a succession sets of the shift signals to the shift register while holding the same row address information in the row selection means.

According to the present invention, a peripheral circuit, especially an address system peripheral circuit which occupied a large proportion of chip area in the heretofore known device memory device, can be widely reduced in size, and hence a large capacity memory can be realized.

In addition, according to the present invention, serial access to memory cells can be achieved at a high speed.

Furthermore, in the memory device according to the present invention, it is possible to eliminate the address input terminals, and hence the number of external terminals of a memory IC can be widely reduced.

BRIEF DESCRIPTION OF THE DRAWINGS

The above-mentioned and other features and objects of the present invention will become more apparent by reference to the following description of its preferred embodiments taken in conjunction with the accompanying drawings, wherein.

DETAILED DESCRIPTION OF THE INVENTION

Figure 1:
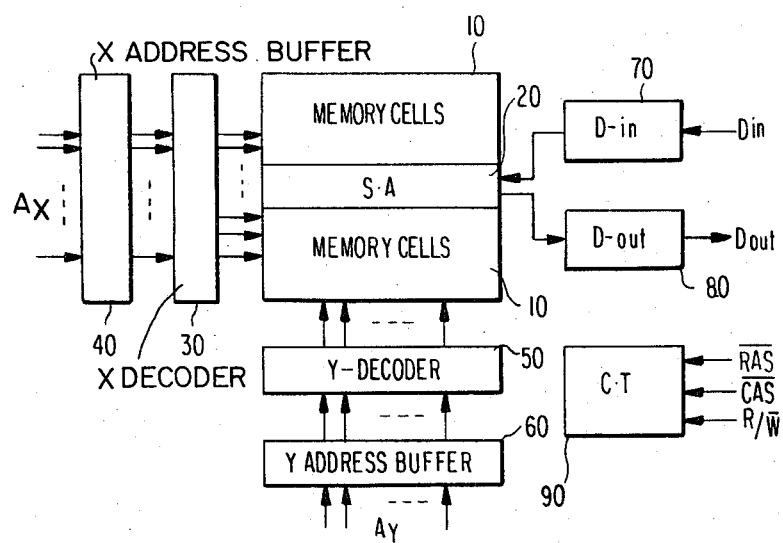
FIG. 1 is a chip layout diagram of a MOS dynamic RAM in the prior art.

Referring now to the accompanying drawings, one example of a construction of a heretofore known dynamic memory is shown in FIG. 1. Such type of memories are illustrated and described in detail in U.S. Pat. No. 3,969,706 issued to R. J. Proebsting et al.

With reference to FIG. 1, on a semiconductor chip for realizing a dynamic memory are constructed memory cells 10 arrayed in a matrix form of M rows by N columns, sense amplifier section 20 including N sense amplifier circuits, an X coder circuit 30 and an X address buffer circuit 40 both of M bits, a Y decoder circuit 50 and a Y address buffer circuit 60 both of N bits, a data-in buffer circuit 70, a data-out buffer circuit 80 and a control timing generator circuit 90.

In such a memory device in the prior art, the proportion of the area occupied by the memory cell 10 on the chip is approximately 40%, and more than one-half of the chip area is occupied by the peripheral circuits. Consequently, if the memory capacity is increased, then the area occupied by the peripheral circuit is enlarged in accordance with the increase, and hence it was difficult in the prior art to provide a memory device having a high density.

Figure 2:
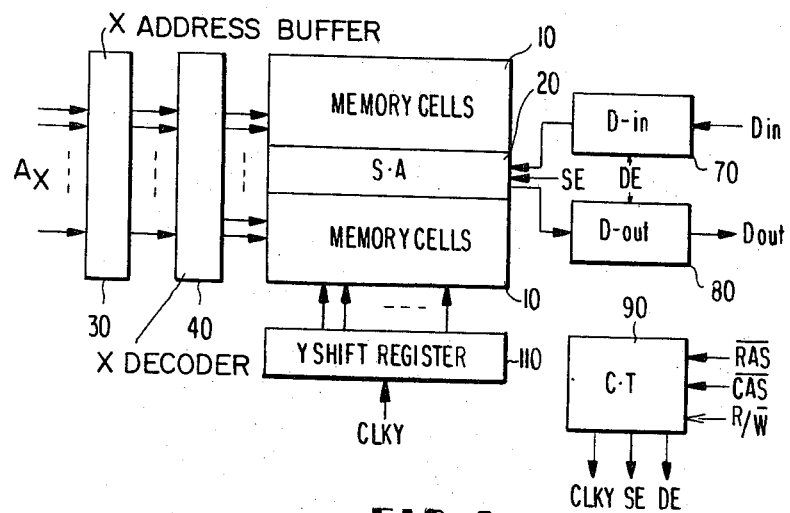

One preferred embodiment of the present invention is illustrates in FIG. 2. In this preferred embodiment, the Y decoder circuit 50 and Y address buffer circuit 60 of N bits in the MOS dynamic RAM shown in FIG. 1 are replaced by a Y shift register 110 of N bits. With regard to the other function blocks, that is, with regard to the memory cells 10, sense amplifier circuits 20, X address buffer circuit 40, data-in buffer circuit 70, data-out buffer circuit 80 and control timing generation circuit 90, circuit structures similar to those disclosed in the above-referred U.S. Pat. No. 3,969,706 could be employed. In the following description, the X address corresponds to a refresh address, that is, the address of the word line, while the Y address corresponds to the address of the digit line. The shift register 110 has N-bit parallel outputs, and the respective N output signals are used for controlling transfer gates for digit selection. This shift register 110 has its shift controlled by pulses CLKY which are generated each time a column strobe signal ($\overline{CAS}$) changes from its reset condition to its enable condition. This shift register 110 operates in such manner that among the N parallel outputs only one output can take a selection level, and in one structure such as, for example, an N-channel MOS transistor structure, information of "1" is successively shifted from the input stage towards the final stage and further from the final stage again to the input stage, whereby the information of "1" can be held as circulated through the shift register in synchronism with the pulses CLKY. Accordingly, it is necessary to set it at an initial condition after switching on a power supply to the memory, where only one bit is at the selection level and the remaining bits are all kept at the non-selection level. The detailed structure of the shift register 110 should not be limited at all, and any known shift registers such as those disclosed, for instance, in U.S. Pat. Nos. 3,648,066; 3,559,010 and 3,621,279 are available. Here, it is to be noted that the above-referred pulses CLKY are generally multi-phase clock pulses adapted to control the shift of these shift registers, but they are representatively indicated by a single pulse input CLKY in FIG. 2.

Figure 11:
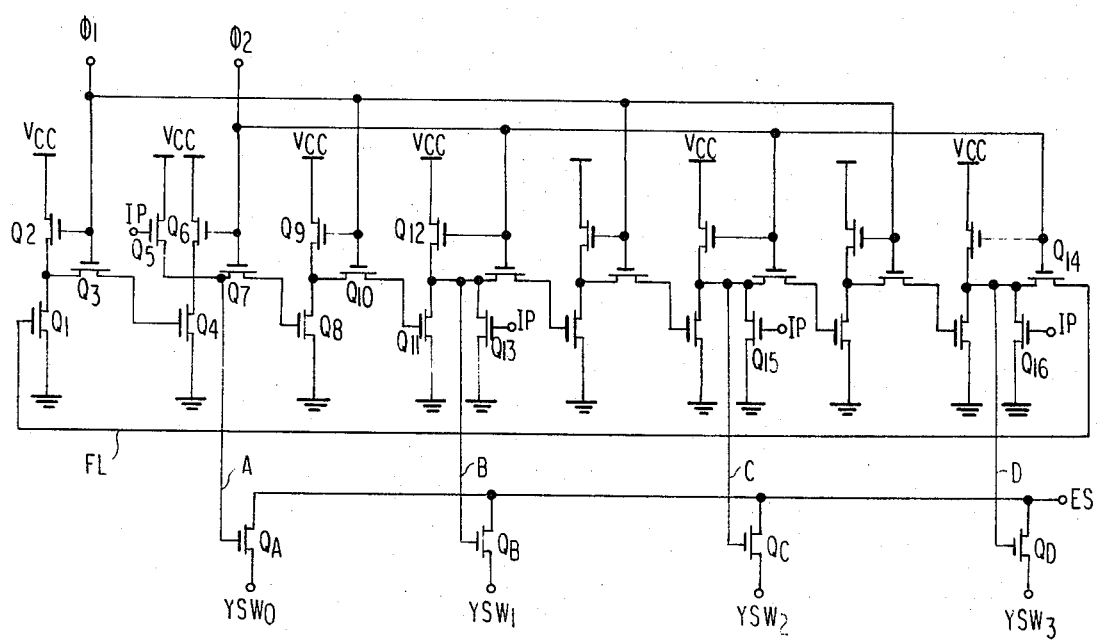
FIG. 11 is a circuit diagram showing one example of the shift register to be used in the preferred embodiments of the present invention.

One practical example of the shift register 110 is illustrated in FIG. 11 with respect to a 4-bit structure.

By way of example, a shift register employing N-channel MOS transistors will now be described. In FIG. 11, MOS transistors $Q_1$ to $Q_6$ form a first bit stage, and MOS transistors $Q_7$ to $Q_{12}$ form a second bit stage. Subsequently, a third bit stage and a fourth bit stage are constructed in the same manner as the second bit stage. The output (D) of the fourth bit stage is fed back to the input of the first bit stage through a feedback line FL.

Control pulses $\phi_1$ and $\phi_2$ are practical example of the pulses CLKY, the pulse $\phi_1$ achieves sampling function for shift, and the pulse $\phi_2$ achieves activation of output data. For instance, as the pulse $\phi_1$ an inverted signal of the pulse CLKY can be used, and as the pulse $\phi_2$ the pulse CLKY itself can be used. Otherwise, the pulses $\phi_1$ and $\phi_2$ could be generated in such manner that when the $\overline{CAS}$ changes from a high level to a low level, the pulse $\phi_1$ takes a high level, and when the $\overline{CAS}$ changes from a low level to a high level, the pulse $\phi_2$ takes a high level for a predetermined period.

In the illustrated example, in the first bit stage between the output A and a voltage source $V_{CC}$ is connected a transistor $Q_5$ whose gate is applied with an initial conditioning pulse IP, but in the second, third and fourth bit stages between the outputs B, C and D, respectively, and the ground are connected transistors $Q_{13}$, $Q_{15}$ and $Q_{16}$ whose gates are applied with the initial conditioning pulse IP. After a power supply to the memory has been switched on, the initial conditioning pulse IP is generated in one shot to make these transistors conducting and forcibly setting only the output A at a high level and the other outputs B, C and D at a low level. The respective outputs A, B, C and D for this shift register are connected to Y-select gate terminals $Y_{SW0}$ to $Y_{SW3}$, respectively, via source-follower transistors $Q_A$, $Q_B$, $Q_C$ and $Q_D$ whose drains are applied with a drive signal ES. In the case where the load is small, as a matter of course, the outputs A, B, C and D could be directly connected to the Y-select gate terminals $Y_{SW0}$ to $Y_{SW3}$.

Now one example of operation of the memory illustrated in FIG. 2 will be explained with reference to FIG. 6. It is to be noted that both the row address strobe signal $\overline{RAS}$ and the column address strobe signal $\overline{CAS}$ command active operations at their low level.

Figure 6:
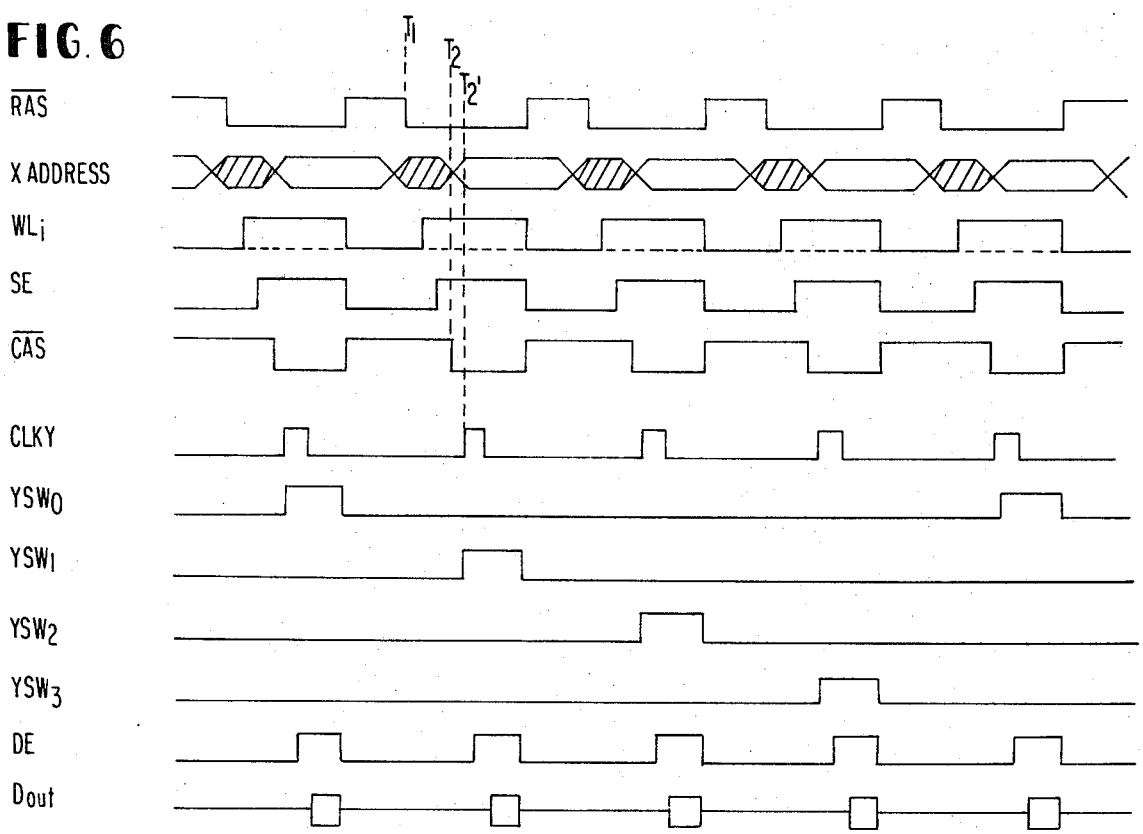
FIG. 6 is a waveform diagram showing one example of operation of the preferred embodiment illustrated in FIG. 2.

At time $T_1$, the $\overline{RAS}$ changes from a high level to a low level, then the information at the X-address input terminals $A_X$, that is, the X-address represented by a hatched portion in FIG. 6 is latched in the X-address buffer circuit 40, and one of wordlines WLi designated by this X-address is selected by the X-decoder 30. With a little delay after the selection of the word line WL$_i$, a sense amplifier enable signal SE is generated in the control timing generator circuit 90 in response to the low level of the $\overline{RAS}$, and the signal SE activates the sense amplifiers 20, so that refresh of memory cells connected to the selected word line is effected.

Subsequently, at time $T_2$, the $\overline{CAS}$ changes from a high level to a low level, hence a control pulse CLKY at a high level is generated. The bit position storing the information of "1" in the shift register 110 is shifted by one step, and thereby a select gate terminal $Y_{SW1}$ for a digit line corresponding to the shifted position is selected.

Next, upon reading, in response to a data enable signal DE at a high level that has been generated in response to the low level of the $\overline{CAS}$, the data-out buffer circuit 80 is activated, and the read out data appears at an output terminal $D_{out}$. It is to be noted that upon writing, the data-in buffer circuit 70 is activated instead of the circuit 80, and the data fed to an input terminal $D_{in}$ are written in the selected memory cell.

As described above, in the preferred embodiment shown in FIG. 2, the $\overline{RAS}$ system control in the heretofore known memory of the multistrobe system is in itself used for the X-address control, and with regard to the Y-address control, access to the memory can be controlled by merely effecting shift of a shift register in response to change of the $\overline{CAS}$. In this preferred embodiment, the Y shift register 110 has the number of necessary transistors therein reduced to a fraction of one as compared to the Y-decoder 50 and Y-address buffer 60 in the memory shown in FIG. 1, and accordingly it becomes possible to reduce the size of the semiconductor chip for the memory. Alternatively, it is possible to increase the memory capacity of the memory cell matrix 10 by the corresponding amount.

Figure 8:
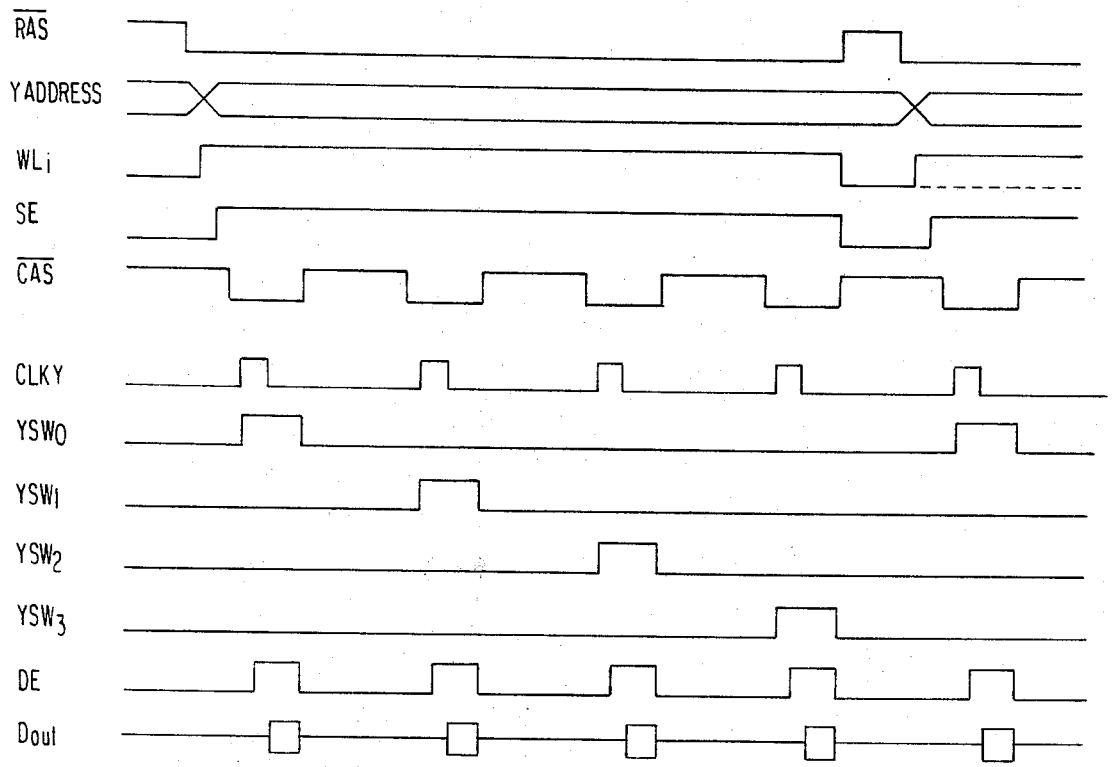
FIG. 8 is a waveform diagram showing another example of operation of the preferred embodiment illustrated in FIG. 2, FIGS. 9 and 10 are waveform diagrams respectively showing two different examples of operation of the preferred embodiment illustrated in FIG. 4.

The address control according to this preferred embodiment is suitable to be applied to a page mode of reading, that is, a mode of access in which with the X-address fixed at one address only the Y-address is changed in sequence. In this case, the sequential access to different memory cells connected to the same word line can be achieved at a high speed by repeating the activation of the $\overline{CAS}$ only without repeating the activation of the $\overline{RAS}$, as shown in FIG. 8.

While it was assumed in the above description that the control pulse CLKY is generated when the CAS has changed from a high level to a low level, on the contrary the control pulse CLKY could be generated when the CAS changes from a low level to a high level.

Figure 3:
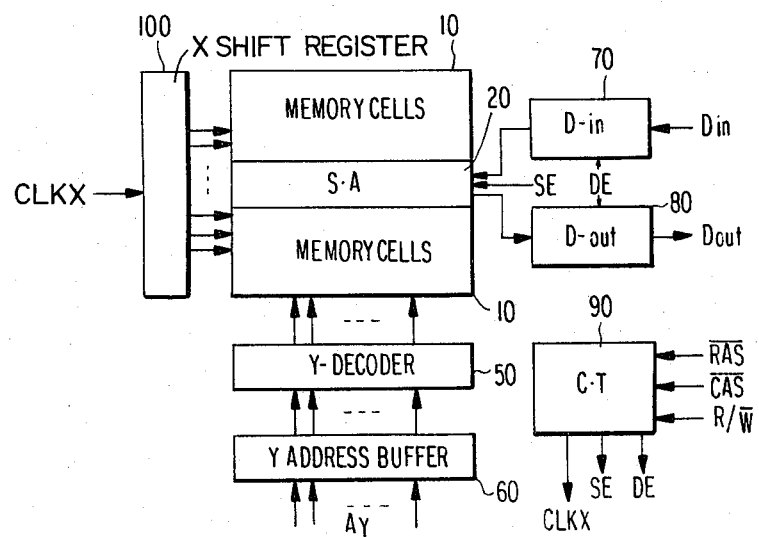
FIGS. 2, 3 and 4 are similar chip layout diagrams respectively showing different preferred embodiments of the present invention.

Another preferred embodiment of the present invention is illustrated in FIG. 3. In this preferred embodiment, the X-decoder circuit 30 and X-address buffer circuit 40 of M bits in the MOS dynamic RAM shown in FIG. 1 are replaced by an X-shift register 100. In this case, the X shift register 100 is constructed in the same manner as the Y shift register 110 in FIG. 2 except for the point that the shift of the X shift register 100 has its shift controlled by a control pulse CLKX that is generated each time the $\overline{RAS}$ is activated and its parallel outputs are used for selectively driving the word lines.

Figure 7:
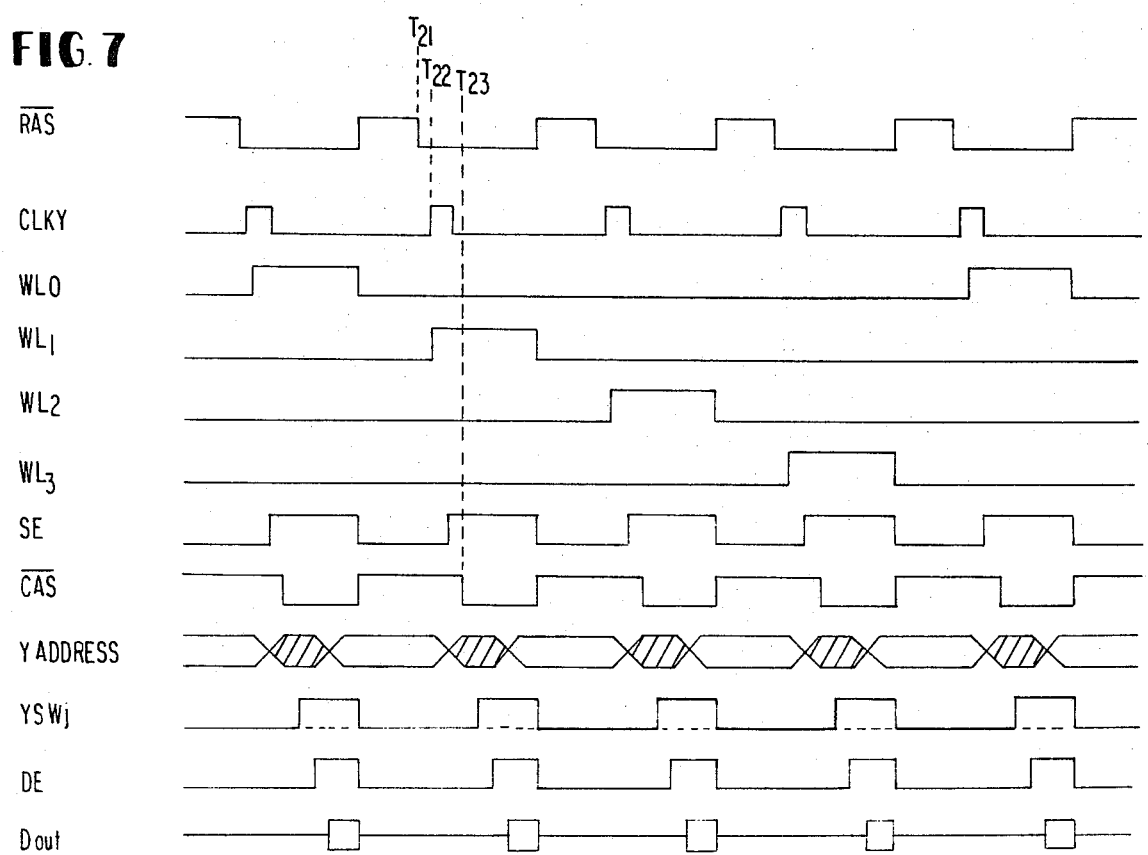
FIG. 7 is a waveform diagram showing one example of operation of the preferred embodiment illustrated in FIG. 3.

FIG. 7 shows one example of operation of the memory illustrated in FIG. 3. At time $T_{21}$ the $\overline{RAS}$ changes from a high level to a low level, then a control pulse CLKX is generated, so that the position of the information of "1" in the X shift register 100 is shifted from a position corresponding to a word line WL$_0$ to the next position corresponding to a word line WL$_1$. Thus the word line WL$_1$ is driven to a selection level. In succession, an enable signal SE is activated to refresh the contents of the memory cells connected to the word line WL$_1$. Subsequently, when the $\overline{CAS}$ is activated at time $T_{23}$, address information then appearing at address terminals A$_Y$, that is, Y-address indicated by a hatched portion in FIG. 7 is introduced into the Y-address buffer circuit 60 and latched therein. A digit line selection gate terminal $Y_{SWj}$ designated by this Y-address is selected by the Y-decoder 50, and then data appear at an output terminal $D_{out}$.

Figure 4:
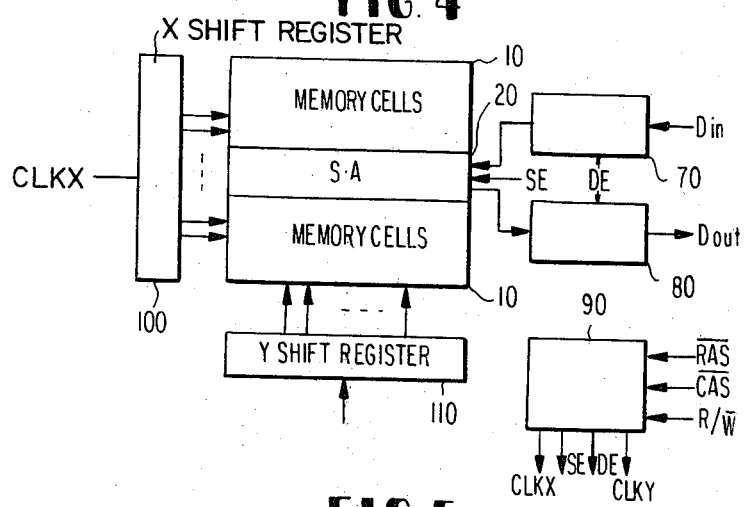

Still another preferred embodiment of the present invention is illustrated in FIG. 4. In this preferred embodiment, the X-decoder circuit 30 and X-address buffer circuit 40 of M bits in the MOS dynamic RAM in FIG. 1 are replaced by an X shift register 100, and the Y-decoder circuit 50 and Y-address buffer circuit 60 of N bits in the same are replaced by a Y-shift register 110.

Figure 5:
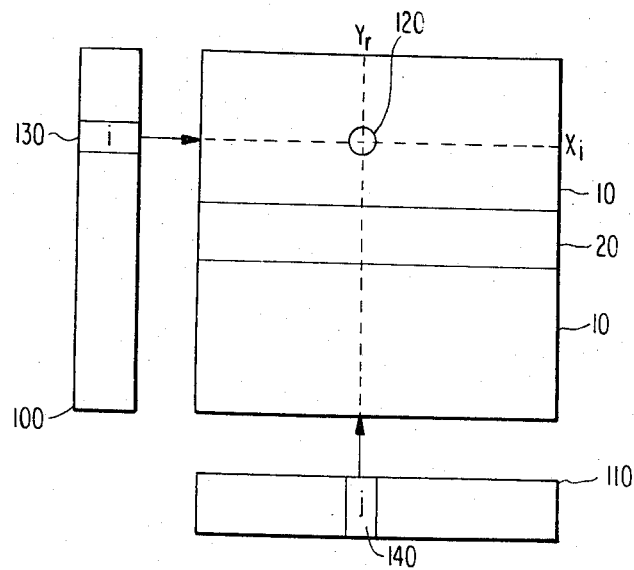
FIG. 5 is a schematic layout diagram to be used for explaining the operation of the memory device illustrated in FIG. 4.

Now, brief description of one example of operation in the preferred embodiment shown in FIG. 4 will be made with reference to FIG. 5. The X shift register 100 is advanced to a position 130 corresponding to the i-th bit (i=1, ..., m), while the Y shift register 110 is advanced to a position 140 corresponding to the j-th bit (j=1, ..., n). If access is made under such a condition, then the memory can operate as a RAM (Access can be made to a position 120 of any arbitrary address $X_i Y_j$.). On the other hand, if access is made while the Y shift register 110 is being advanced in sequence under the condition where the X shift register 100 has been advanced to the j-th bit position 130, or if access is made while the X shift register 100 is being advanced in sequence under the condition where the Y shift register 110 has been advanced to the j-th bit position 140, then the memory operates as an n-bit or m-bit serial memory device, respectively.

In one modification of the above-described preferred embodiment in FIG. 4, an output of the Y shift register 110 is fed to a shift input of the X shift register 100, or an output of the X shift register 100 is fed to a shift input of the Y shift register 110. If access is made under such a condition, then the memory acts as an M×N-bit serial memory device.

Figure 9:
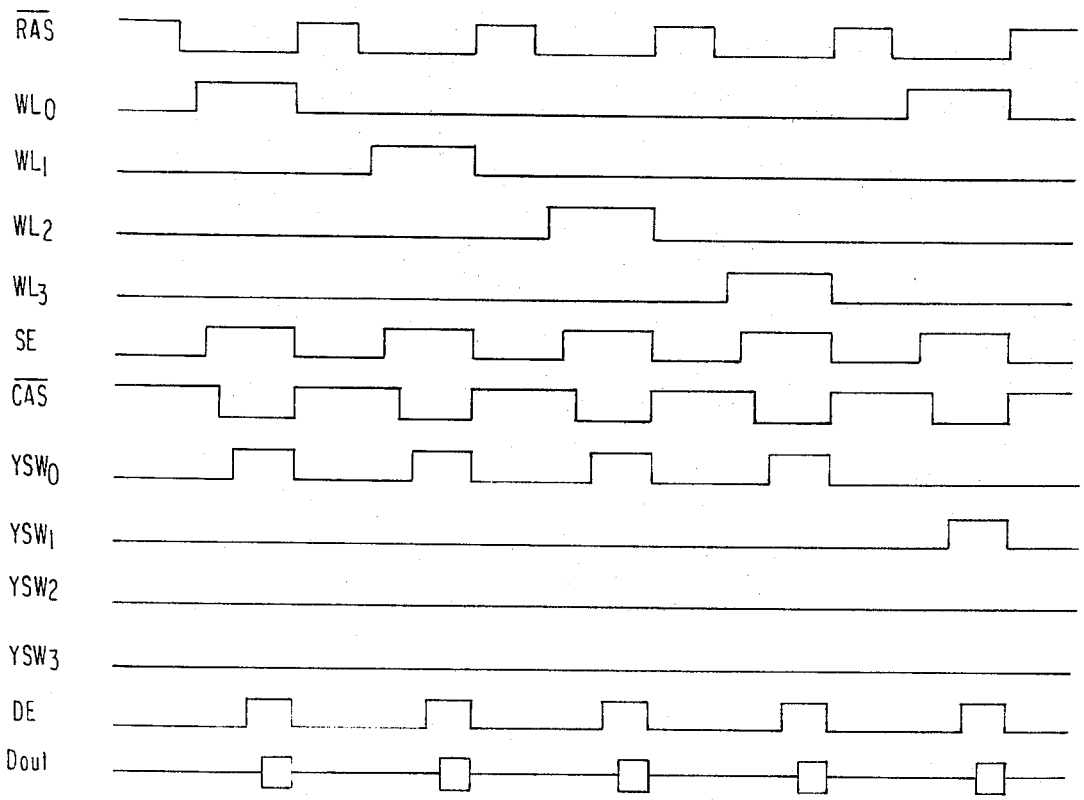

One example of operation of the memory in the above-described modified case is shown in FIG. 9. In this example, all the memory cells connected to one word line can be sequentially read out by activating the $\overline{CAS}$ N times during one activation period of the $\overline{RAS}$. It is to be noted that in the above-described operation, driving by means of the $\overline{CAS}$ only becomes possible by employing a carry signal generated upon full shift of the Y shift register 110 as the control pulse CLKX without using the $\overline{RAS}$.

Figure 10:
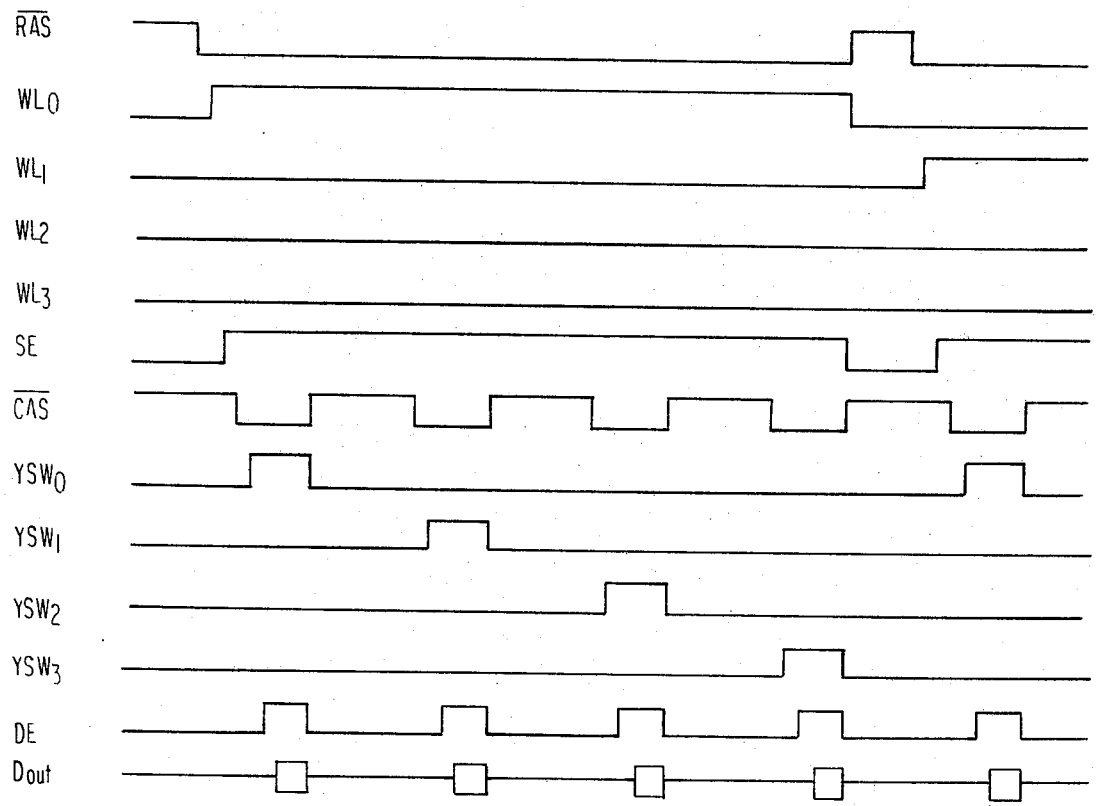

On the contrary, a modified operation can be achieved by employing a carry signal generated upon each full shift of the X shift register 100 as the control pulse CLKY. One example of this modified operation is shown in FIG. 10. In other words, in this modified operation, with respect to each Y-address all the X-addresses are sequentially selected in response to the RAS. In this case, if further modification is made such that the control signals for the circuits in the Y-address system may be generated for each access without relying upon the CAS, then driving by means of the RAS only becomes possible. In such modified cases, although the memory system departs from the general concept of the multi-strobe system, in essence the subject memory device is not limited by the names of strobe signals RAS and CAS, but it is the most important feature of the present invention that operations of a memory device can be controlled by one or two strobe signals without necessitating any special address input terminals.

I claim:

1. A memory device comprising a memory cell matrix including a plurality of memory cells arranged in rows and columns, a plurality of sense amplifiers associated with said columns, means for selecting one of said rows, means for operatively enabling said sense amplifiers thereby to refresh the contents of the memory cells associated with the selected rows, a shift register having a plurality of output terminals, a plurality of column drive transistors each having a control terminal coupled to an associated one of said output terminals of said shift register, a first terminal adapted to receive a column drive pulse and a second terminal from which a column drive signal for an associated one of said columns is derived, a plurality of initializing transistors, one of said initializing transistors being coupled between one of said output terminals and a power voltage terminal, the remainder of said initializing transistors being coupled between the remainder of said output terminals of said shift register and a reference voltage terminal, means for supplying gates of said initializing transistors with an initializing pulse in common, and control means for controlling shift operation of said shift register.

2. The memory device according to claim 1, further comprising means for receiving a row strobe signal for controlling said row selecting means, and means for receiving a column strobe signal for controlling said control means.

3. The memory device according to claim 1, in which said row selecting means includes a shift register whose outputs are used to select said rows.

4. A memory device comprising a memory cell matrix of a plurality of memory cells arranged in rows and columns, a first shift register having the same number of parallel outputs as the number of said rows, the parallel outputs of said first shift register being used for selecting one of said rows, a second shift register having the same number of parallel outputs as the number of said columns, a power voltage terminal, a reference voltage terminal, a column drive signal terminal, a plurality of source-follower transistors each having a control terminal coupled to an associated one of said parallel outputs of said second shift register, a first terminal coupled to said column drive signal and a second terminal for deriving a gated column drive signal upon selection, the gated column drive signal being used for selecting an associated one of said columns, means for controlling said first shift register, and means for controlling said second shift register.

5. A memory device formed on a semiconductor chip and having a matrix of memory cells arranged in rows and columns, said memory device comprising a plurality of sense amplifiers associated with respective columns, means for receiving a row strobe signal, means for receiving a column strobe signal, row selection means for designating one of said rows, a shift register whose outputs are used to designate one of said columns, means for energizing said row strobe signal over a predetermined period, means for selecting one of said rows by said row selection means during the energization of said row strobe signal, means for enabling said plurality of sense amplifiers to refresh the contents of the memory cells associated with selected rows under the energization of said row strobe signals, means for energizing said column strobe signal, means for setting one of the outputs of said shift register at a selection level in response to the energization of said column strobe signal, means for deriving the content of the memory cell associated with said selected row and the column designated by said shift register, and means for repeatedly performing the energization of said column strobe signal and shifting the content of said shift register on a plurality of consecutive columns over said predetermined period, whereby the contents of the memory cells associated with the selected rows are sequentially read out in response only to the repetition of the energization of said column strobe signal during said predetermined period.

6. The memory device according to claim 5, further comprising means for generating a column drive signal by transferring a pulse signal in response to the outputs of said shift register through a transfer gate.

* * * * *

UNITED STATES PATENT AND TRADEMARK OFFICE
CERTIFICATE OF CORRECTION

PATENT NO. : 4,386,421

DATED : May 31, 1983

INVENTOR(S) : Yasaburo Inagaki

It is certified that error appears in the above-identified patent and that said Letters Patent is hereby corrected as shown below:

```
Column 3, line 64, change "coder" to --decoder--.
Column 5, line 16, change "for" to --of--.
Column 6, line 16, change "CAS" to --$\overline{CAS}$--.
Column 7, line 28, change "RAS" to --$\overline{RAS}$--.
Column 7, line 32, change "CAS" to --$\overline{CAS}$--.
Column 7, line 32, change "RAS" to --$\overline{RAS}$--.
Column 7, line 36, change "RAS" to --$\overline{RAS}$--
Column 7, line 37, change "CAS" to --$\overline{CAS}$--.
```

Signed and Sealed this

Seventeenth Day of April 1984

[SEAL]

Attest:

GERALD J. MOSSINGHOFF

*Attesting Officer*  *Commissioner of Patents and Trademarks*